(12) United States Patent
Inoue et al.

(10) Patent No.: US 11,482,607 B2
(45) Date of Patent: Oct. 25, 2022

(54) SEMICONDUCTOR DEVICE AND METHOD FOR MANUFACTURING SEMICONDUCTOR DEVICE

(71) Applicant: Mitsubishi Electric Corporation, Tokyo (JP)

(72) Inventors: Atsufumi Inoue, Tokyo (JP); Tatsuro Watahiki, Tokyo (JP); Kengo Matsufuji, Tokyo (JP); Kojiro Hara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 70 days.

(21) Appl. No.: 17/279,585

(22) PCT Filed: Dec. 5, 2018

(86) PCT No.: PCT/JP2018/044730
§ 371 (c)(1),
(2) Date: Mar. 25, 2021

(87) PCT Pub. No.: WO2020/115838
PCT Pub. Date: Jun. 11, 2020

(65) Prior Publication Data
US 2021/0343854 A1    Nov. 4, 2021

(51) Int. Cl.
*H01L 29/45*   (2006.01)
*H01L 29/40*   (2006.01)
(Continued)

(52) U.S. Cl.
CPC ........ *H01L 29/45* (2013.01); *H01L 21/02178* (2013.01); *H01L 21/0485* (2013.01);
(Continued)

(58) Field of Classification Search
CPC ............... H01L 29/45; H01L 29/66348; H01L 29/7397; H01L 29/7813; H01L 29/41725;
(Continued)

(56) References Cited

U.S. PATENT DOCUMENTS

| | | |
|---|---|---|
| 2012/0007241 A1 | 1/2012 | Mizuno |
| 2013/0234131 A1 | 9/2013 | Tanaka et al. |
| 2017/0222009 A1 | 8/2017 | Hikasa et al. |

FOREIGN PATENT DOCUMENTS

| | | |
|---|---|---|
| JP | 2000-183063 A | 6/2000 |
| JP | 2013-214732 A | 10/2013 |

(Continued)

OTHER PUBLICATIONS

International Search Report and Written Opinion dated Mar. 12, 2019, received for PCT Application PCT/JP2018/044730 Filed on Dec. 5, 2018, 8 pages including English Translation.

*Primary Examiner* — Joseph C. Nicely
(74) *Attorney, Agent, or Firm* — Xsensus LLP

(57) ABSTRACT

An object is to provide a semiconductor device that can prevent organic contamination of an electrode including a plurality of laminated metal layers. A semiconductor device includes: a semiconductor substrate; and an electrode including a plurality of layers laminated on a principal surface of the semiconductor substrate. The electrode includes: a first metal layer in contact with the principal surface of the semiconductor substrate, the first metal layer containing Al; an oxide layer formed on a surface of the first metal layer, the oxide layer containing a metal and oxygen; and a second metal layer formed on a surface of the oxide layer. Concentrations of the oxygen in the oxide layer are higher than or equal to $8.0 \times 10^{21}/cm^3$ and lower than or equal to $4.0 \times 10^{22}/cm^3$.

5 Claims, 12 Drawing Sheets

(51) Int. Cl.
*H01L 29/66* (2006.01)
*H01L 29/739* (2006.01)
*H01L 21/04* (2006.01)
*H01L 23/532* (2006.01)
*H01L 29/417* (2006.01)
*H01L 21/02* (2006.01)
*H01L 29/78* (2006.01)

(52) U.S. Cl.
CPC ...... *H01L 23/53223* (2013.01); *H01L 29/401* (2013.01); *H01L 29/41725* (2013.01); *H01L 29/66348* (2013.01); *H01L 29/7397* (2013.01); *H01L 29/7813* (2013.01)

(58) Field of Classification Search
CPC ........... H01L 21/0485; H01L 21/02178; H01L 23/53223
See application file for complete search history.

(56) References Cited

FOREIGN PATENT DOCUMENTS

| | | |
|---|---|---|
| JP | 2017-135283 A | 8/2017 |
| WO | 2010/109572 A1 | 9/2010 |

F I G. 1 1
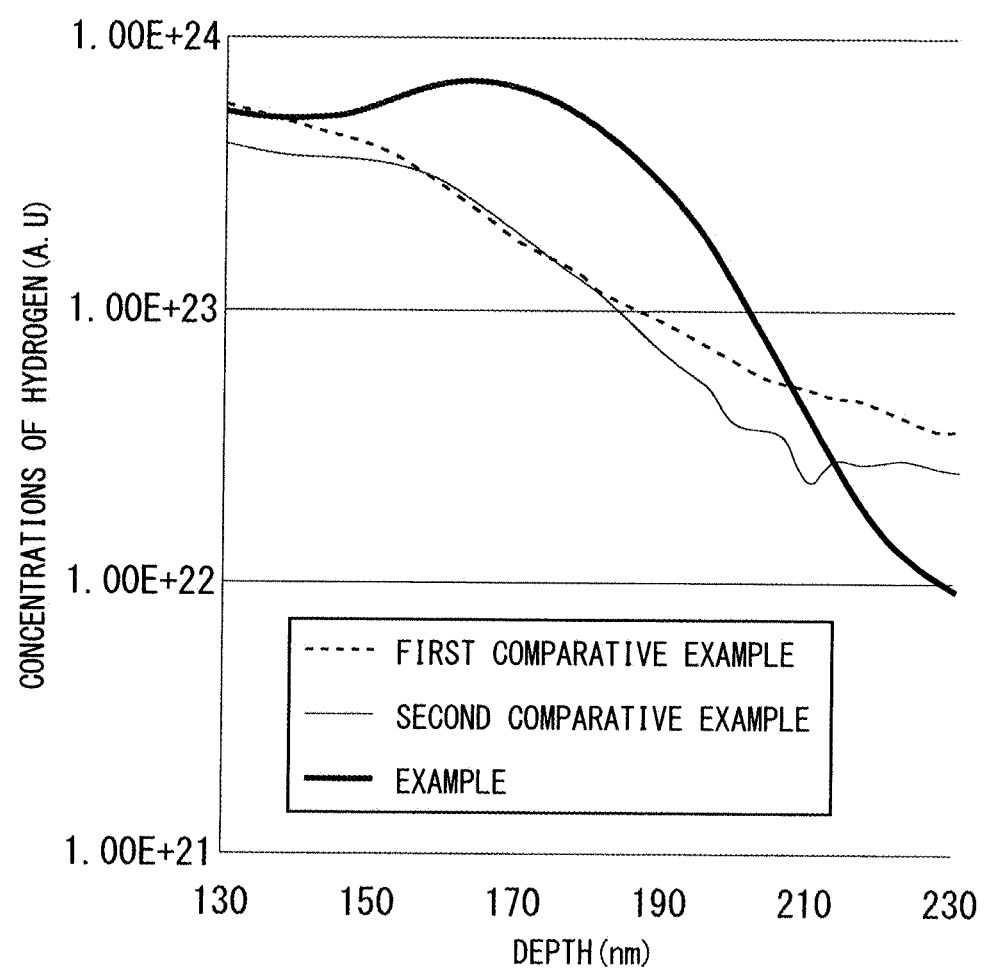

2

SEMICONDUCTOR DEVICE AND METHOD FOR MANUFACTURING SEMICONDUCTOR DEVICE

CROSS-REFERENCE TO RELATED APPLICATION

The present application is based on PCT filing PCT/JP2018/044730, filed Dec. 5, 2018, the entire contents of which are incorporated herein by reference.

TECHNICAL FIELD

The present invention relates to a semiconductor device and a method for manufacturing the semiconductor device.

BACKGROUND ART

A power semiconductor module includes an insulated-gate bipolar transistor (IGBT) that controls switching of a high current, and a diode that blocks a reverse current that is generated in the switching. Power semiconductor modules are used in various fields including household electrical appliances and vehicle equipment as main components of power converters.

A semiconductor device inside the power semiconductor module includes, on a surface of a semiconductor substrate, an electrode or wiring including a plurality of metal layers (see, for example, Patent Documents 1 to 4). The semiconductor device described in Patent Document 1 includes, on a rear surface of a semiconductor substrate, a rear electrode obtained by laminating an AlSi layer, a polysilicon layer, a Ti layer, an Ni layer, and an Au layer in order. The rear electrode is fixed to an external component such as a separate board. Thus, the semiconductor device is electrically connected to the external component.

PRIOR ART DOCUMENT

Patent Document

[Patent Document 1] WO2010/109572
[Patent Document 2] Japanese Patent Application Laid-Open No. 2000-183063
[Patent Document 3] Japanese Patent Application Laid-Open No. 2017-135283
[Patent Document 4] Japanese Patent Application Laid-Open No. 2013-214732

SUMMARY

Problem to be Solved by the Invention

When an electrode including a plurality of metal films as described above is formed on a surface of a semiconductor substrate included in a semiconductor device, the metal films are sometimes exposed to the atmosphere during the film formation processes. For example, when the metal films are formed by different film forming apparatuses depending on the type of metal or formed through different film formation processes, taking the semiconductor substrate outside the film forming apparatuses sometimes causes the metal films to be exposed to the atmosphere.

The environment in which the film formation processes are performed, for example, the atmosphere in a clean room includes organic matter components. Even if the atmospheric exposure time during which the metal films are exposed to the atmosphere is short, the electrode being formed is contaminated by the organic matters in the clean room.

The present invention has been conceived to solve such a problem, and has an object of providing a semiconductor device that can prevent organic contamination of the electrode including a plurality of laminated metal layers.

Means to Solve the Problem

A semiconductor device according to the present invention includes: a semiconductor substrate; and an electrode including a plurality of layers laminated on a principal surface of the semiconductor substrate. The electrode includes: a first metal layer in contact with the principal surface of the semiconductor substrate, the first metal layer containing Al; an oxide layer formed on a surface of the first metal layer, the oxide layer containing a metal and oxygen; and a second metal layer formed on a surface of the oxide layer. Concentrations of the oxygen in the oxide layer are higher than or equal to $8.0 \times 10^{21}/\mathrm{cm}^3$ and lower than or equal to $4.0 \times 10^{22}/\mathrm{cm}^3$.

Effects of the Invention

The present invention can provide a semiconductor device that prevents organic contamination of an electrode including a plurality of laminated metal layers.

The object, features, aspects and advantages of the present invention will become more apparent from the following detailed description and the accompanying drawings.

BRIEF DESCRIPTION OF DRAWINGS

FIG. 11 illustrates concentrations of hydrogen in the vicinity of the boundary between the adhesion layer and the barrier layer.

DESCRIPTION OF EMBODIMENTS

Figure 1:
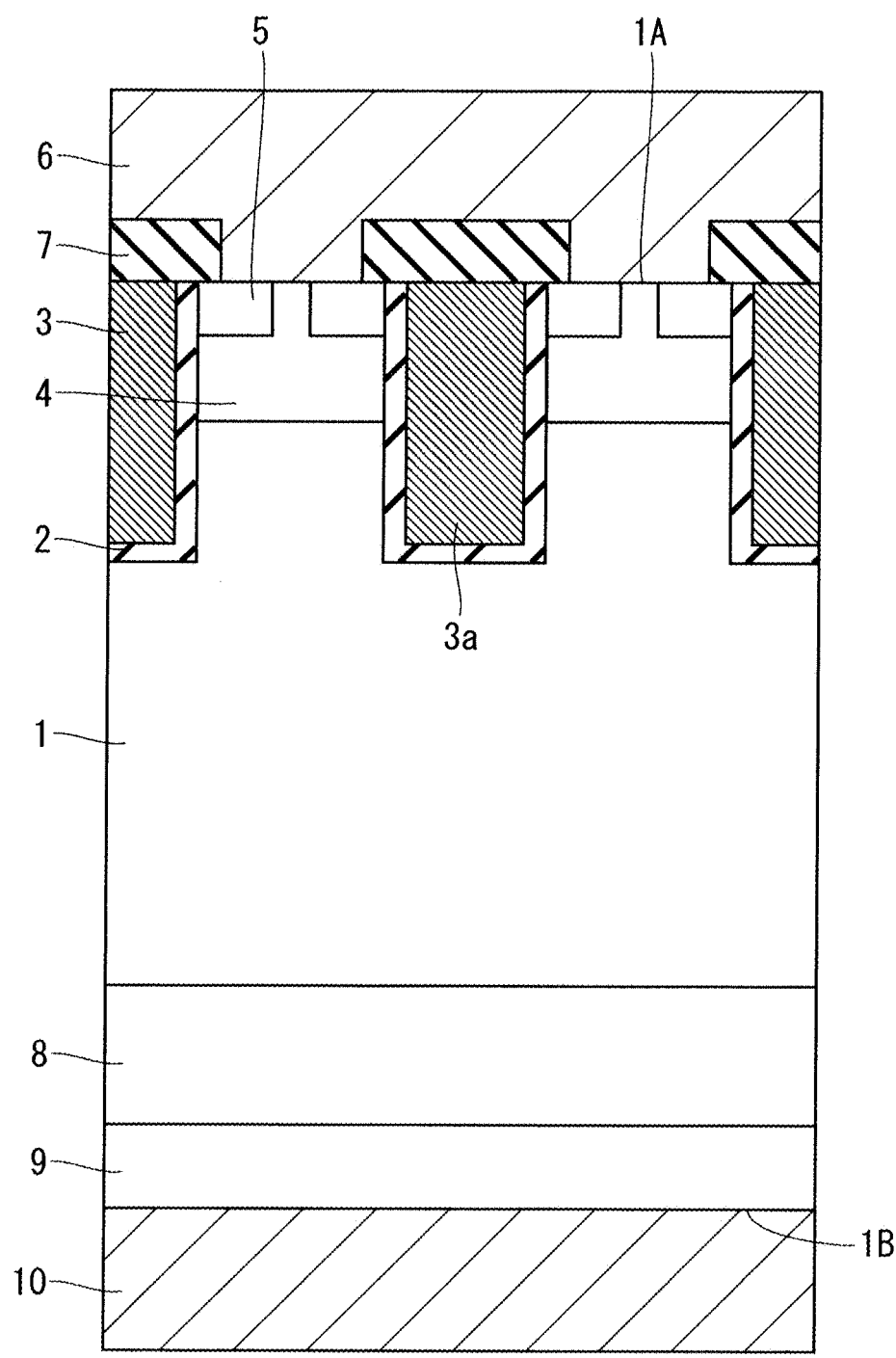
FIG. 1 is a cross-sectional view illustrating a structure of a semiconductor device according to Embodiment 1.

Embodiments will be described with reference to the drawings. In the drawings, the contraction scale of each component included in a semiconductor device is sometimes different from that of the actual semiconductor device.

Embodiment 1

FIG. 1 is a cross-sectional view illustrating a structure of a semiconductor device according to Embodiment 1. The semiconductor device is, for example, a power semiconductor device. The semiconductor device according to Embodiment 1 is an insulated-gate bipolar transistor (IGBT). Here, the semiconductor device is not limited to the IGBT but may be, for example, a metal-oxide-semiconductor field-effect transistor (MOSFET) or a diode.

The IGBT includes a semiconductor substrate 1. The semiconductor substrate 1 contains low-concentration dopants, and has n-type conductivity. The semiconductor substrate 1 contains, for example, a wide bandgap semiconductor such as SiC or GaN as a material.

The surface structure of the IGBT is formed on a surface 1A of the semiconductor substrate 1. A plurality of trenches 3a with openings are formed in the surface 1A of the semiconductor substrate 1. A trench gate 3 that is a gate electrode is embedded in each of the trenches 3a. A gate insulating film 2 surrounding each of the trench gates 3 insulates the trench gate 3 from the semiconductor substrate 1. Furthermore, a base layer 4 is formed between the adjacent gate insulating films 2 as a p-type impurity layer. An emitter layer 5 that is a high concentration n-type impurity layer is formed as a part of a surface layer of the base layer 4, that is, a part of a surface layer of the semiconductor substrate 1. The emitter layer 5 is in contact with the gate insulating films 2. Furthermore, the emitter layer 5 is in contact with the base layer 4 on its bottom and on a side opposite to that in contact with the gate insulating film 2. The base layer 4 and the emitter layer 5 are connected to an emitter electrode 6 on the surface 1A of the semiconductor substrate 1. An interlayer insulating film 7 is formed between the emitter electrode 6 and the trench gates 3. The interlayer insulating film 7 insulates the emitter electrode 6 from the trench gates 3. The trench gates 3 are connected to a gate electrode (not illustrated).

A collector layer 9 is formed in a rear surface 1B of the semiconductor substrate 1. A buffer layer 8 is formed deeper than the collector layer 9 with respect to a position of the rear surface 1B of the semiconductor substrate 1. The buffer layer 8 is in contact with the collector layer 9. A collector electrode 10 is in contact with the collector layer 9 on the rear surface 1B of the semiconductor substrate 1. Specifically, the buffer layer 8 that is an n-type impurity layer, the collector layer 9 that is a p-type impurity layer, and the collector electrode 10 are disposed in this order.

Figure 2:
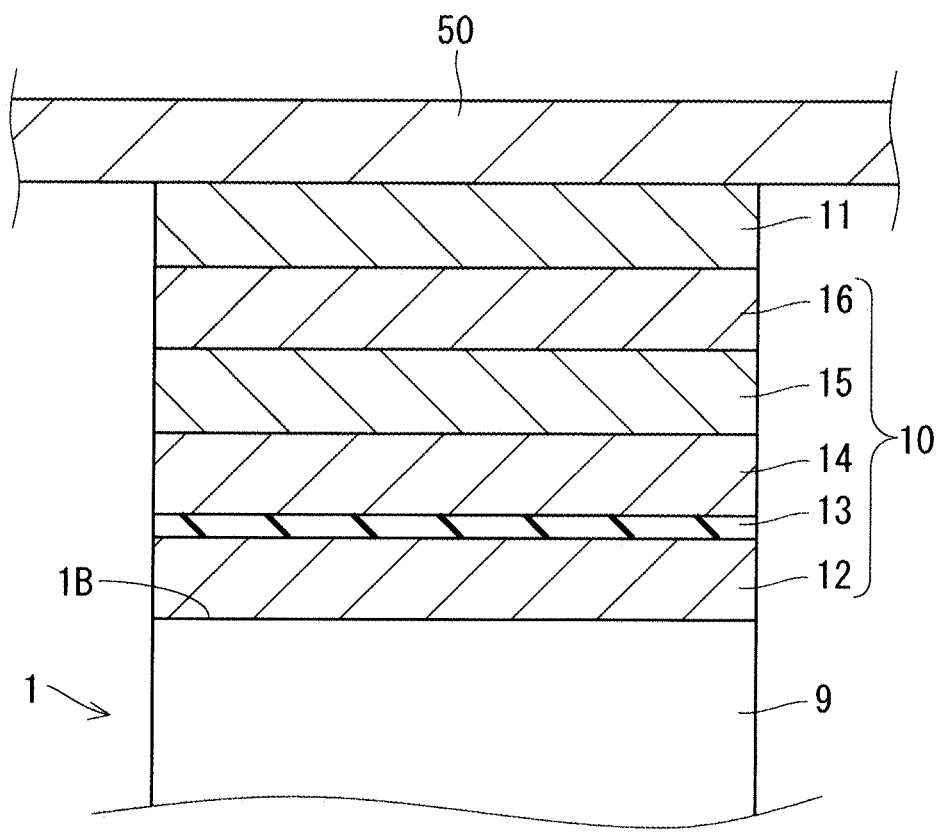
FIG. 2 is a cross-sectional view illustrating a laminated structure of a collector electrode according to Embodiment 1.

FIG. 2 is a cross-sectional view illustrating a laminated structure of the collector electrode 10 according to Embodiment 1.

The collector electrode 10 is bonded to a conductive board 50 through a low-melting metal layer 11. The low-melting metal layer 11 is melted and secured through a thermal treatment process for fixing the collector electrode 10 to the board 50. The low-melting metal layer 11 includes, for example, solder.

The collector electrode 10 includes a plurality of layers laminated on the rear surface 1B of the semiconductor substrate 1. The collector electrode 10 includes a first metal layer in contact with the rear surface 1B of the semiconductor substrate 1, an oxide layer 13 formed on the surface of the first metal layer, and a second metal layer formed on the surface of the oxide layer 13. In Embodiment 1, the first metal layer corresponds to an adhesion layer 12, and the second metal layer corresponds to a barrier layer 14.

The collector electrode 10 according to Embodiment 1 further includes an electrode layer 15 on the surface of the barrier layer 14, and an affinity layer 16 on the surface of the electrode layer 15.

The adhesion layer 12 is a metal layer containing, as a main component, Al having good adhesion to a semiconductor. The adhesion layer 12 according to Embodiment 1 is an Al alloy produced by adding Si to Al. The concentration of the added Si is approximately 1 wt % for preventing the diffusion of Si atoms in the adhesion layer 12. The adhesion layer 12 is preferably 700 to 1000 nm thick. The adhesion layer 12 improves the adhesion between the collector layer 9 that is a semiconductor and the collector electrode 10 that are made of metals.

The oxide layer 13 contains a metal and oxygen. The oxide layer 13 according to Embodiment 1 contains an Al oxide. The oxide layer 13 is preferably several to 7 nm thick. The oxide layer 13 prevents carbon contamination while suppressing increase in the electrical resistance of the collector electrode 10.

The barrier layer 14 contains a high-melting metal, for example, Ti. The barrier layer 14 is preferably 80 to 140 nm thick. The barrier layer 14 has a function of separating the electrode layer 15 from the adhesion layer 12. In the absence of the barrier layer 14, contact of the molten metal of the low-melting metal layer 11 with the collector electrode 10 for a long time causes a part of the affinity layer 16, the electrode layer 15, or the adhesion layer 12 to be melted into the molten metal. Contact of the molten metal with the collector layer 9 generates voids, thus deteriorating the electrical characteristics or the reliability. The barrier layer 14 prevents erosion of the low-melting metal layer 11 and reduces the voids to be generated, in the thermal treatment process for fixing the collector electrode 10 to the board 50. Furthermore, the barrier layer 14 improves the adhesion with the adhesion layer 12.

The electrode layer 15 contains a metal with a low resistance. The electrode layer 15 contains, for example, nickel or a nickel alloy. The electrode layer 15 improves the adhesion between the barrier layer 14 and the affinity layer 16 that are disposed above and below the electrode layer 15.

The affinity layer 16 is disposed in the surface of the collector electrode 10. The affinity layer 16 contains gold having high affinity to a low-melting metal. The affinity layer 16 improves the adhesion between the collector electrode 10 and the low-melting metal layer 11.

Figure 3:
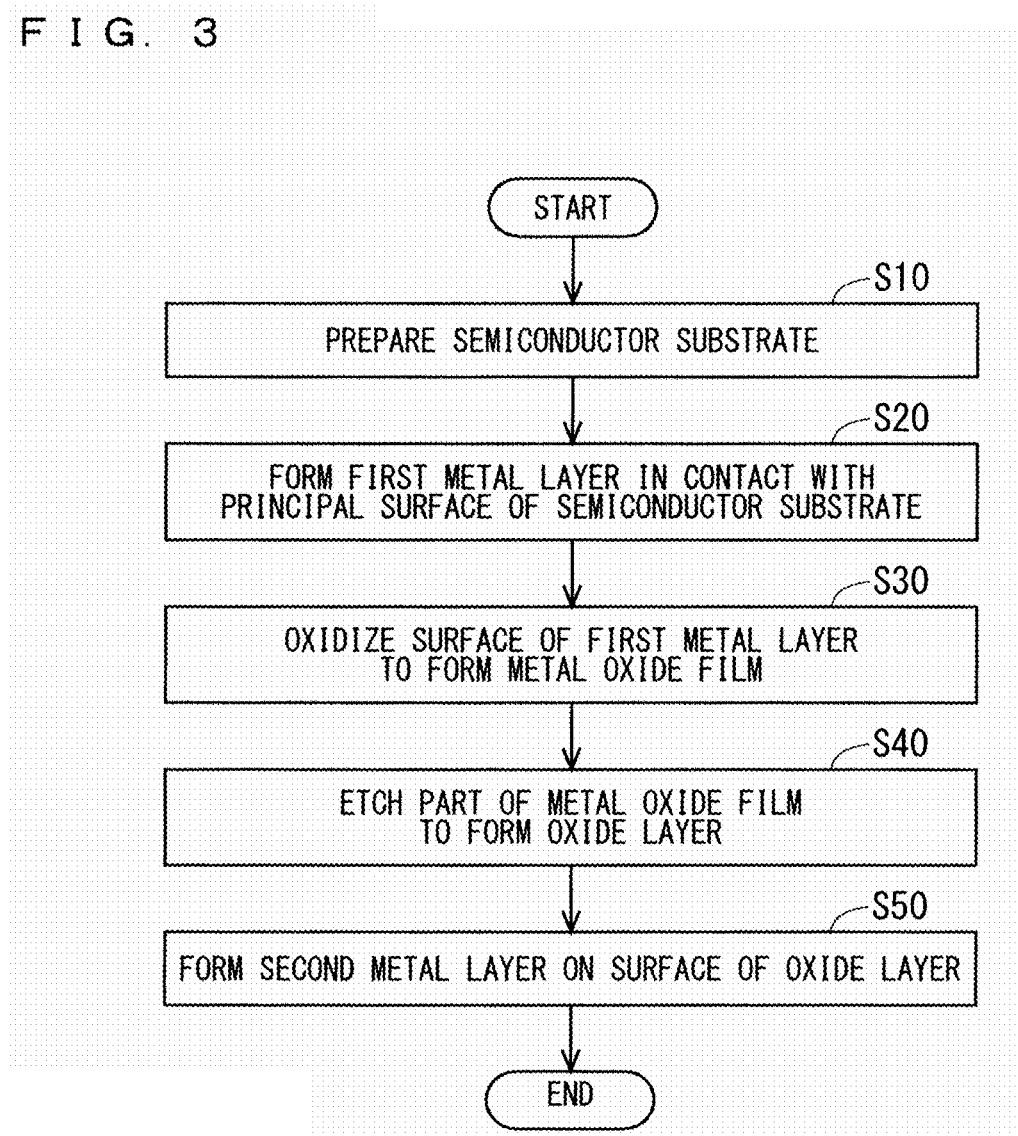
FIG. 3 is a flowchart illustrating a method for manufacturing the semiconductor device according to Embodiment 1.

FIG. 3 is a flowchart illustrating a method for manufacturing the semiconductor device according to Embodiment 1.

Figure 4:
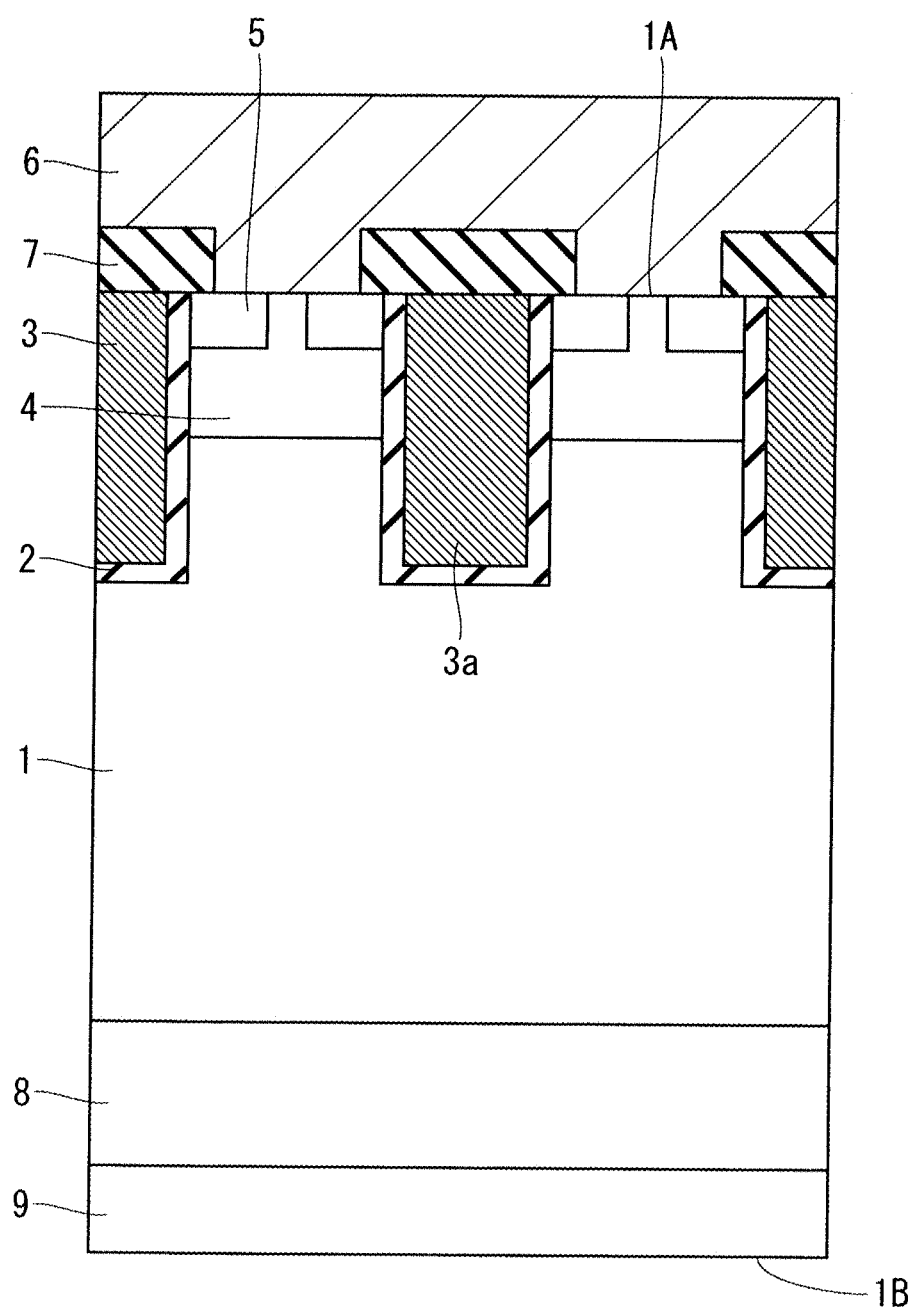
FIG. 4 illustrates a structure of a semiconductor substrate before the collector electrode is formed.

In Step S10, the semiconductor substrate 1 is prepared. FIG. 4 illustrates a structure of the semiconductor substrate 1 prepared in Step S10. The semiconductor substrate 1 prepared herein is in a state where the collector layer 9 of the IGBT is exposed and the collector electrode 10 has not yet been formed. Many surface structures of the IGBT are formed in the surface 1A of the semiconductor substrate 1.

Figure 5:
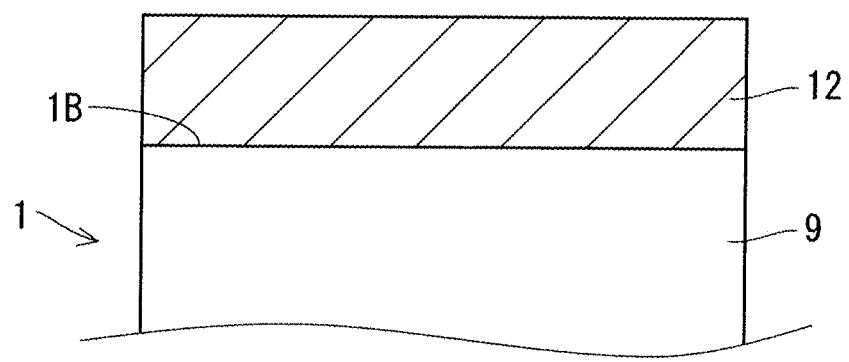
FIG. 5 illustrates the semiconductor substrate on which an adhesion layer is formed.

In Step S20, the first metal layer in contact with the principal surface of the semiconductor substrate 1 is formed. Here, the adhesion layer 12 in contact with the surface of the collector layer 9, that is, the rear surface 1B of the semiconductor substrate 1 is formed. FIG. 5 illustrates the semiconductor substrate 1 on which the adhesion layer 12 is formed. The adhesion layer 12 is formed on the rear surface 1B of the semiconductor substrate 1 transported into a vacuum chamber, for example, by sputtering. The adhesion layer 12 is an Al alloy containing Al and Si.

Figure 6:
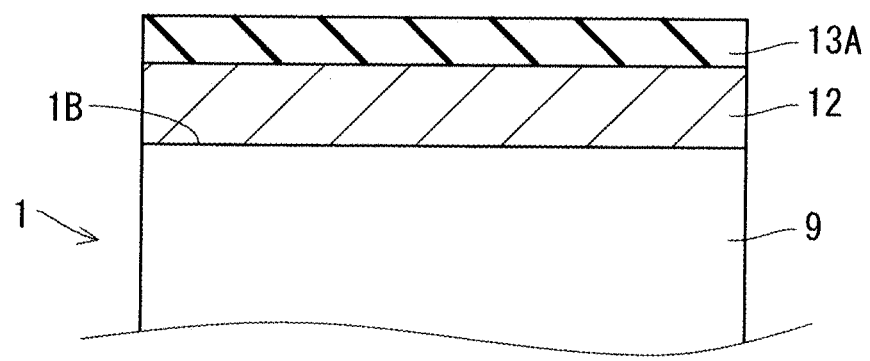
FIG. 6 illustrates the semiconductor substrate above which a metal oxide film is formed.
Figure 7:
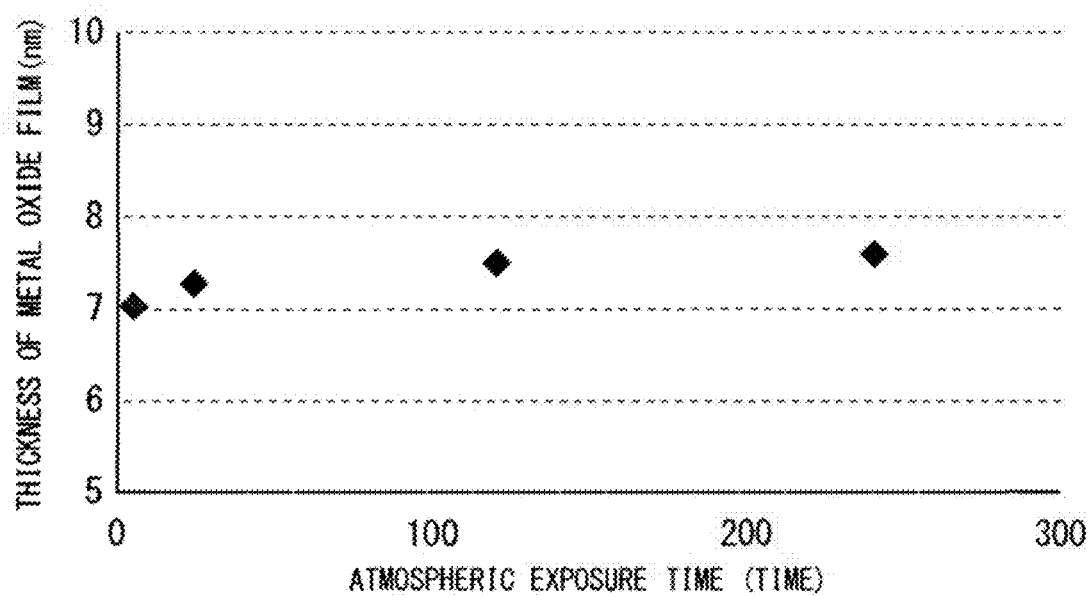
FIG. 7 illustrates a relationship between an elapsed time after the atmospheric exposure and the thickness of the metal oxide film.

In Step S30, the surface of the first metal layer is oxidized to form a metal oxide film. Here, the surface of the adhesion layer 12 is oxidized to form a metal oxide film. FIG. 6 illustrates the semiconductor substrate 1 above which a metal oxide film 13A is formed. The metal oxide film 13A is formed by, for example, heating the semiconductor substrate 1 using an oven system, etc., into which oxygen has been introduced. Alternatively, the metal oxide film 13A is formed by, for example, exposing the semiconductor substrate 1 taken out of the vacuum chamber to the atmosphere. Here, the metal oxide film 13A is a native oxide film. The metal oxide film 13A according to Embodiment 1 is formed by the atmospheric exposure. FIG. 7 illustrates a relationship between an elapsed time after the atmospheric exposure and the thickness of the metal oxide film 13A. The thickness of the metal oxide film 13A was measured using a spectroscopic ellipsometer. The metal oxide film 13A exposed to the atmosphere was 7 nm or thicker after five hours, approximately 7.3 nm thick after 24 hours, and approximately 7.5 nm thick after 120 hours and 240 hours. The oxidation of the adhesion layer 12 is almost saturated in 120 hours after the atmospheric exposure. As such, the metal oxide film 13A having a thickness of 7 nm or greater is formed with the atmospheric exposure time of five hours or longer. The metal oxide film 13A, which is formed by oxidizing the adhesion layer 12 containing Al, contains, as a main component, an Al oxide containing Al and oxygen.

Figure 8:
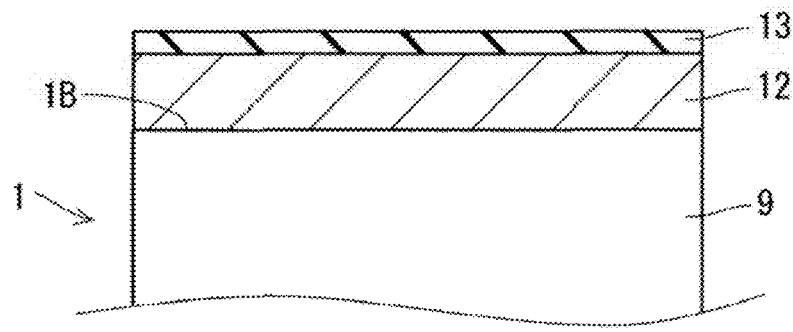
FIG. 8 illustrates the semiconductor substrate above which an oxide layer is formed.

In Step 40, a part of the metal oxide film 13A is etched to form the oxide layer 13. FIG. 8 illustrates the semiconductor substrate 1 above which the oxide layer 13 is formed. The oxide layer 13 is etched through, for example, wet treatment for immersing the semiconductor substrate 1 into an acidic chemical solution or dry treatment for exposing the semiconductor substrate 1 to ion or plasma. The acidic chemical solution in the wet treatment is, for example, hydrofluoric acid. The plasma in the dry treatment contains, for example, hydrogen. The metal oxide film 13A according to Embodiment 1 is etched using plasma containing hydrogen and Ar. The oxide layer 13 has a thickness enough to suppress the alloying reaction of Al and Ti, at a thermal treatment temperature applied when the collector electrode 10 is fixed to the board 50 through the low-melting metal layer 11. The thermal treatment temperature is, for example, approximately 300° C. to 500° C., and the oxide layer 13 is preferably several to 7 nm thick. Thus, etching approximately at least a fraction of a nanometer of the metal oxide film 13A formed in Step S30 can form the oxide layer 13 with the thickness having the aforementioned range.

In Step S50, the second metal layer is formed on the surface of the oxide layer 13. In Embodiment 1, the barrier layer 14, the electrode layer 15, and the affinity layer 16 are formed in order on the surface of the oxide layer 13. Immediately after the oxide layer 13 is formed, the semiconductor substrate 1 is moved to another vacuum chamber. The barrier layer 14 is formed, in the vacuum chamber, on the surface of the oxide layer 13 by sputtering. Here, the barrier layer 14 is a Ti thin film. The Ti thin film is formed by, for example, sputtering a Ti target with a sputtering gas containing Ar gas. Furthermore, the electrode layer 15 and the affinity layer 16 are formed by sputtering or vapor deposition.

With the aforementioned steps, the IGBT including the collector electrode 10 on the rear surface 1B of the semiconductor substrate 1 is completed. The IGBT is fixed to the board 50 through the low-melting metal layer 11, thus fabricating the structure illustrated in FIG. 2.

Figure 9:
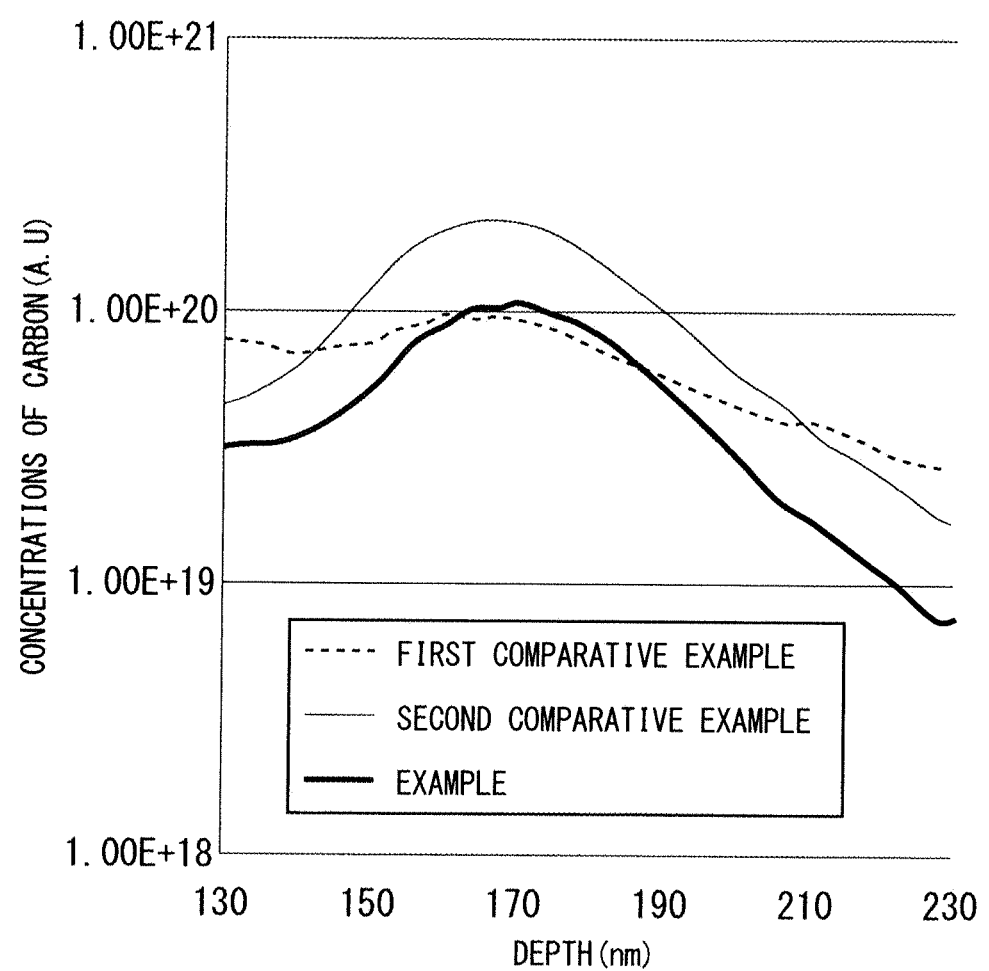
FIG. 9 illustrates concentrations of carbon in the vicinity of a boundary between the adhesion layer and a barrier layer.
Figure 10:
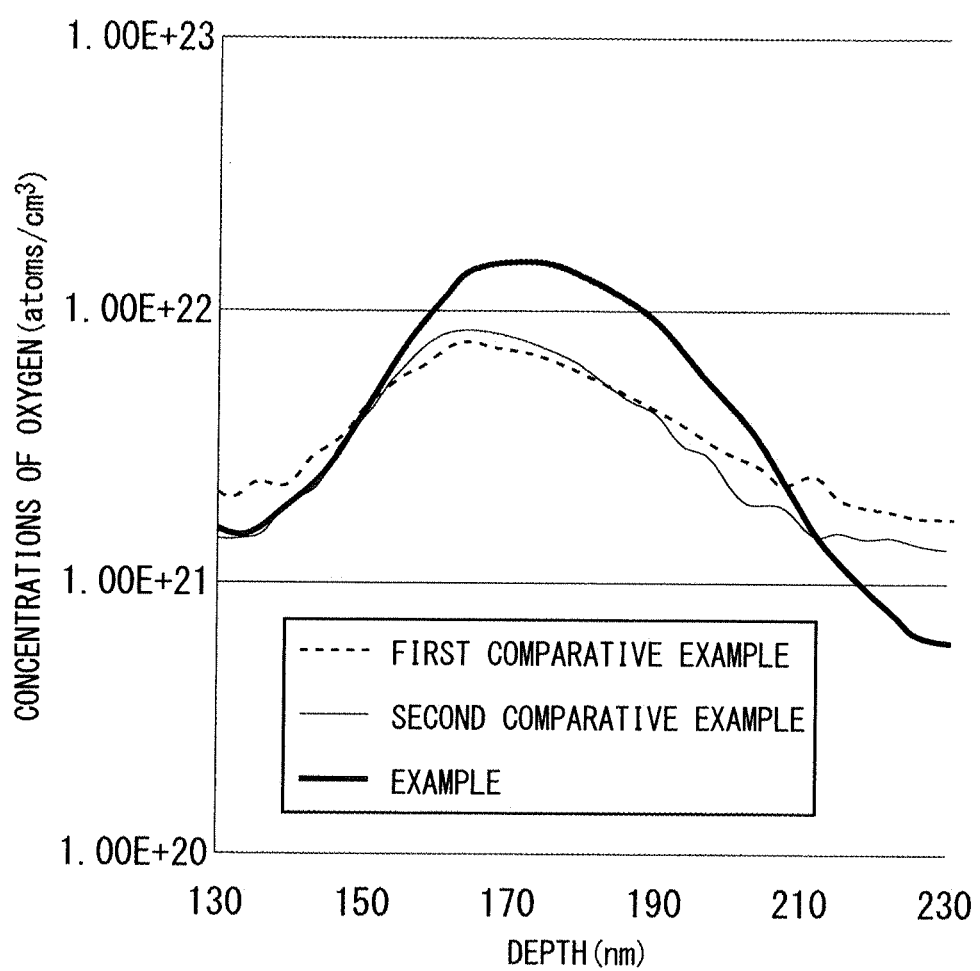
FIG. 10 illustrates concentrations of oxygen in the vicinity of the boundary between the adhesion layer and the barrier layer.

FIGS. 9 to 11 illustrate the results of the secondary ion mass spectrometry (SIMS) analysis in the vicinity of the boundary between the adhesion layer 12 and the barrier layer 14 in the collector electrode 10. FIG. 9 illustrates concentrations of carbon. FIG. 10 illustrates concentrations of oxygen. FIG. 11 illustrates concentrations of hydrogen. Each of the drawings illustrates three results of the first and second comparative examples, and Example.

Figure 12:
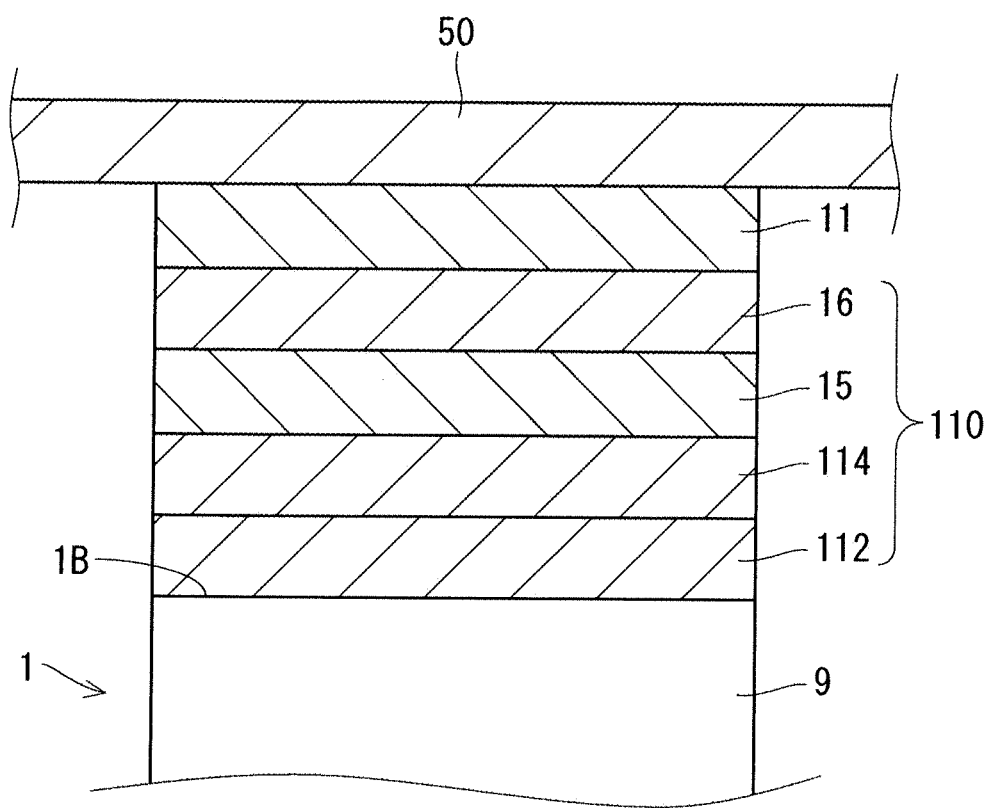
FIG. 12 is a cross-sectional view illustrating a laminated structure of a collector electrode according to the first comparative example.

FIG. 12 is a cross-sectional view illustrating a laminated structure of a collector electrode 110 according to the first comparative example. The semiconductor device according to the first comparative example differs from the semiconductor device according to Embodiment 1 in the structure from an adhesion layer 112 to a barrier layer 114 and the processes of forming these layers. The barrier layer 114 according to the first comparative example was formed within several hours after formation of the adhesion layer 112. Then, the surface of the adhesion layer 112 was not etched.

The semiconductor device according to the second comparative example in FIGS. 9 to 11 differs from the semiconductor device according to Embodiment 1 in the structure from the adhesion layer to the barrier layer and the processes of forming these layers. The barrier layer was formed after two weeks since formation of the adhesion layer. Then, the metal oxide film formed on the surface of the adhesion layer was not etched.

The semiconductor device according to Example in FIGS. 9 to 11 was fabricated in the manufacturing method illustrated in FIG. 3. The barrier layer 14 was formed after two weeks since formation of the adhesion layer 12. Then, the metal oxide film 13A formed on the surface of the adhesion layer 12 was etched. Immediately after that, the barrier layer 14 was formed.

In any of the first and second comparative examples, and Example, the adhesion layer contains Al, and the barrier layer contains Ti. Any of the collector electrodes 10 described in the first and second comparative examples, and Example satisfy a predetermined electrical resistance value required for power semiconductor devices. Furthermore, it was determined, based on the secondary ion intensity data of Al and Ti (not illustrated), that the depth ranging from 130 to 230 nm coincides with the boundary between the adhesion layer and the barrier layer in FIGS. 9 to 11. Thus, the oxide layer 13 of the semiconductor device according to Embodiment 1 exists at the depth ranging from 130 to 230 nm.

As illustrated in FIG. 9, the concentrations of carbon peak at the depth ranging from 150 to 180 nm in any of the first and second comparative examples, and Example. The peak values of the concentrations of carbon are higher in the order of the second comparative example, Example, and the first comparative example. Particularly, the peak value of the concentrations of carbon in the second comparative example is the highest. This suggests increase in the extent of organic contamination because the elapsed time from formation of the adhesion layer to formation of the barrier layer, that is, the atmospheric exposure time is two weeks which is the longest of the three. Besides, the elapsed time from formation of the adhesion layer 12 to formation of the barrier layer 14 in Example is also two weeks, similarly to the second comparative example. However, the peak value of the concentrations of carbon in Example is lower than that of the second comparative example, and is as high as that of the first comparative example. This is because etching of the surface of the adhesion layer 12 after formation of the adhesion layer 12 reduces the organic matters adhered to the surface thereof.

As illustrated in FIG. 10, the concentrations of oxygen peak at the depth ranging from 150 to 180 nm in any of the first and second comparative examples, and Example. The peak values of the concentrations of oxygen are higher in the order of Example, the second comparative example, and the first comparative example. Particularly, the peak value of the concentrations of oxygen in Example is the highest. The elapsed time from formation of the adhesion layer to formation of the barrier layer differs between the first and second comparative examples. The elapsed time of the first comparative example is several hours, whereas the elapsed time of the second comparative example is two weeks. Thus, the elapsed time of the second comparative example is longer than that of the first comparative example. Since the natural oxidation in the second comparative example was facilitated more than that in the first comparative example, the peak value of the concentrations of oxygen in the second comparative example is higher than that of the first comparative example. Although etching the surface of the adhesion layer 12 after formation of the adhesion layer 12 thins the metal oxide film 13A, the rough structure produced by the etching increases the surface area and consequently facilitates the oxidation. Furthermore, etching of the organic matters adhered to the surface renders the surface of the adhesion layer 12 susceptible to oxidation. This resulted in facilitation of the oxidation, and increased the peak value of the concentrations of oxygen in Example. The peak of the concentrations of oxygen in Example is greater than those in the first and second comparative examples at a depth ranging from 150 to 200 nm. Thus, the oxide layer 13 exists at the depth ranging from 150 to 200 nm after etching of the metal oxide film 13A. The concentrations of oxygen were detected at the depth ranging from 150 to 200 nm based on the principle of the SIMS, though the thickness of the oxide layer 13 is 7 nm or less.

As illustrated in FIG. 11, the concentrations of hydrogen in the first and second comparative examples decrease from the barrier layer to the adhesion layer. On the other hand, the concentrations of hydrogen in Example peak near 170 nm. Furthermore, the peak value of the concentrations of hydrogen in Example is higher than those of the first and second comparative examples. As described above, the metal oxide film 13A according to Embodiment 1 is etched using plasma containing hydrogen as dry treatment. Thus, the concentrations of hydrogen in Example are higher than those of the first and second comparative examples.

As described above, the oxide layer 13 is a thin film with a thickness of 7 nm or less, and has a high surface area to bulk ratio. Thus, the oxide layer 13 that is a thin film is susceptible to the effect of a termination structure on the surface. The concentrations of hydrogen in Example are higher than those of the first and second comparative examples, and are higher than the concentrations of oxygen. Since the surface of a metal oxide is terminated by a bridging oxygen (O) or a hydroxyl group (OH), termination by the hydroxyl group (OH) is dominant on the surface of the oxide layer 13 higher in the concentrations of hydrogen. Distortion on the OH-terminated surface is smaller than that on the O-terminated surface. Thus, the stress accumulated in the oxide layer 13 according to Embodiment 1 is smaller than those of the first and second comparative examples.

Next, a preferable range of the concentrations of oxygen in the oxide layer 13 will be described. As described above, the metal oxide film 13A formed on the surface of the adhesion layer 12 is etched through the wet treatment or the dry treatment to form the oxide layer 13. If the etching time is longer, the adhesion layer 12 disposed as a lower layer of the metal oxide film 13A is damaged. Thus, the concentrations of oxygen in the oxide layer 13 have a lower limit value. The lower limit value is $8.0 \times 10^{21}/cm^3$. The oxide layer 13 having the concentrations of oxygen higher than or equal to this lower limit value reduces the carbon contamination in the process of forming the collector electrode 10, and reduces the damage occurring on the adhesion layer 12 in the process of forming the oxide layer 13. If the concentrations of oxygen in the oxide layer 13 are too high, the electrical resistance when the semiconductor device is energized increases, thus causing energy loss. Therefore, the concentrations of oxygen in the oxide layer 13 have an upper limit value. The upper limit value is $4.0 \times 10^{22}/cm^3$. The oxide layer 13 having the concentrations of oxygen lower than or equal to this upper limit value suppresses the increase in the electrical resistance.

Thus, the concentrations of oxygen in the oxide layer 13 are preferably higher than or equal to $8.0 \times 10^{21}/cm^3$ and lower than or equal to $4.0 \times 10^{22}/cm^3$. This can prevent the carbon contamination while suppressing the increase in the electrical resistance.

In summary, the semiconductor device according to Embodiment 1 includes: the semiconductor substrate 1; and an electrode including a plurality of layers laminated on a principal surface of the semiconductor substrate 1. The electrode includes the first metal layer, the oxide layer 13, and the second metal layer. The first metal layer contains Al, and is in contact with the principal surface of the semiconductor substrate 1. The oxide layer 13 contains a metal and oxygen, and is formed on a surface of the first metal layer. The second metal layer is formed on a surface of the oxide layer 13. Concentrations of the oxygen in the oxide layer 13 are higher than or equal to $8.0 \times 10^{21}/cm^3$ lower than or equal to $4.0 \times 10^{22}/cm^3$. According to Embodiment 1, the semiconductor device corresponds to an IGBT, the principal surface of the semiconductor substrate 1 corresponds to the rear surface 1B of the semiconductor substrate 1, the electrode corresponds to the collector electrode 10, the first metal layer corresponds to the adhesion layer 12, and the second metal layer corresponds to the barrier layer 14.

Such a semiconductor device prevents organic contamination of the electrode including a plurality of laminated metal layers.

In a continuous film formation process of continuously forming electrodes each including a plurality of layers, the semiconductor substrates are sometimes warped. The semiconductor substrates have been thinned to achieve the low on-resistance and accelerate the switching speed, particularly, in power semiconductor devices such as high performance in-vehicle IGBTs. When a plurality of layers are continuously formed on a thin semiconductor substrate, the semiconductor substrate is sometimes warped due to the film stress. On the other hand, a division film formation process of dividing film formation processes for each type of a metal film included in an electrode enables thermal treatment on a semiconductor substrate between the film formation processes. Thus, the warpage of the semiconductor substrate is reduced. However, if the semiconductor substrate is exposed to the atmosphere during the film formation processes, organic matters in the atmosphere contaminate the electrode. When the organic matters are taken into the electrode, for example, carbon atoms included in the organic matters are diffused into the electrode in the thermal treatment process after the film formation. This adversely affects the electrical characteristics of the semiconductor device. The semiconductor device according to Embodiment 1 including the oxide layer 13 between the adhesion layer 12 and the barrier layer 14 suppresses the carbon contamination. Thus, the organic matters are not diffused, and the electrical characteristics of the semiconductor device are not deteriorated, in the thermal treatment process after the collector electrode 10 is formed. At the same time, the oxide layer 13 of the semiconductor device prevents the adhesion layer 12 and the barrier layer 14 from reacting to form an alloy with a high resistance in the thermal treatment process.

The semiconductor substrate included in a power semiconductor device contains a wide bandgap semiconductor such as SiC or GaN as a material. The semiconductor substrate including a wide bandgap semiconductor is higher in defect density than a semiconductor substrate made of Si as a material. Thus, the semiconductor substrate including the wide bandgap semiconductor is susceptible to organic contamination. However, since the collector electrode 10 of the semiconductor device according to Embodiment 1 includes the oxide layer 13, the organic contamination of the collector electrode 10 is effectively prevented even when the semiconductor substrate 1 is a wide bandgap semiconductor.

Furthermore, since the concentrations of oxygen in the oxide layer 13 are higher than or equal to $8.0 \times 10^{21}/cm^3$, the oxide layer 13 can sufficiently suppress the organic contamination of the electrode. Furthermore, since the concentrations of oxygen in the oxide layer 13 are lower than or equal to $4.0 \times 10^{22}/cm^3$, the oxide layer 13 can suppress increase in the electrical resistance of the electrode.

Besides using an oven system, etc., into which oxygen can be introduced, the oxide layer 13 can be formed by the natural oxidation through the atmospheric exposure. As such, the oxide layer 13 of the semiconductor device according to Embodiment 1 can be formed at low cost.

Furthermore, the oxide layer 13 of the semiconductor device according to Embodiment 1 has a thickness of 7 nm or less.

Such a semiconductor device can reduce the carbon contamination while preventing increase in the electrical resistance of the electrode, using the oxide layer 13.

Furthermore, the concentrations of hydrogen in the oxide layer 13 of the semiconductor device according to Embodiment 1 are higher than or equal to the concentrations of oxygen in the oxide layer 13.

The oxide layer 13 of such a semiconductor device has a smaller distortion on its surface. This is because most of the surface is occupied by the stable OH-terminated surface. The oxide layer 13 reduces the warpage of the semiconductor substrate, and reduces, for example, flaking of a film.

A method for manufacturing a semiconductor device according to Embodiment 1 includes: preparing the semiconductor substrate 1; and forming an electrode including a plurality of layers laminated on a principal surface of the semiconductor substrate 1. The forming of the electrode includes: forming a first metal layer in contact with the principal surface of the semiconductor substrate 1, the first metal layer containing Al; forming the oxide layer 13 on a surface of the first metal layer, the oxide layer containing a metal and oxygen; and forming a second metal layer on a surface of the oxide layer 13. Concentrations of the oxygen in the oxide layer 13 are higher than or equal to $8.0 \times 10^{21}/cm^3$ and lower than or equal to $4.0 \times 10^{22}/cm^3$. According to Embodiment 1, the semiconductor device corresponds to an IGBT, the principal surface of the semiconductor substrate 1 corresponds to the rear surface 1B of the semiconductor substrate 1, the electrode corresponds to the collector electrode 10, the first metal layer corresponds to the adhesion layer 12, and the second metal layer corresponds to the barrier layer 14.

Such a method for manufacturing a semiconductor device prevents organic contamination of the electrode including a plurality of laminated metal layers. Besides using an oven system, etc., into which oxygen can be introduced, the oxide layer 13 can be formed by the natural oxidation through the atmospheric exposure. The method for manufacturing a semiconductor device according to Embodiment 1 can form the oxide layer 13 at low cost.

Furthermore, the oxide layer 13 formed in the method for manufacturing a semiconductor device according to Embodiment 1 has a thickness of 7 nm or less.

Such a method for manufacturing a semiconductor device enables the semiconductor device to reduce the carbon contamination while preventing increase in the electrical resistance of the electrode, using the oxide layer 13.

In the method for manufacturing a semiconductor device according to Embodiment 1, the forming of the oxide layer 13 includes: oxidizing the surface of the first metal layer to form the metal oxide film 13A; and etching a surface of the metal oxide film 13A.

Such a method for manufacturing a semiconductor device can form the oxide layer 13 at low cost. Furthermore, the method for manufacturing a semiconductor device can accurately form the oxide layer 13 with a predetermined thickness and a predetermined concentration of oxygen. The predetermined thickness is, for example, 7 nm or less. Thus, the predetermined concentration of oxygen are higher than or equal to $8.0 \times 10^{21}/cm^3$ and lower than or equal to $4.0 \times 10^{22}/cm^3$.

In the method for manufacturing a semiconductor device according to Embodiment 1, the etching of the surface of the metal oxide film includes etching the surface of the metal oxide film 13A using plasma containing hydrogen or an acid solution containing hydrogen. The concentrations of the hydrogen in the oxide layer 13 are higher than or equal to concentrations of oxygen in the oxide layer 13.

Such a method for manufacturing a semiconductor device can form the oxide layer 13 with a smaller distortion on its surface. This is because most of the surface of the oxide layer 13 is occupied by the stable OH-terminated surface. The oxide layer 13 reduces the warpage of the semiconductor substrate, and reduces, for example, flaking of a film.

Embodiment 2

A semiconductor device and a method for manufacturing the semiconductor device according to Embodiment 2 will be described. The description of the structure and the operations identical to those according to Embodiment 1 will be omitted.

Figure 13:
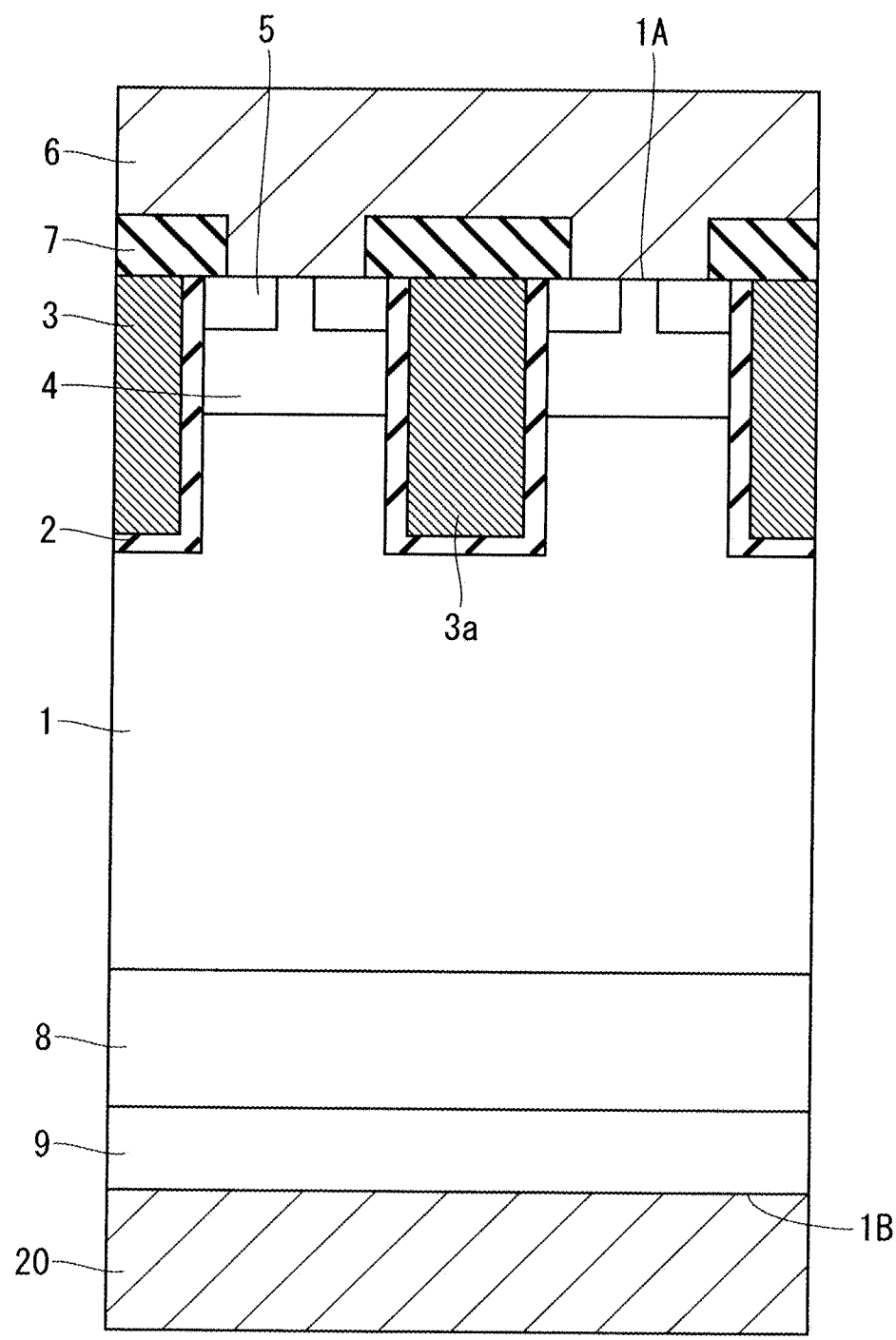
FIG. 13 is a cross-sectional view illustrating a structure of a semiconductor device according to Embodiment 2.

FIG. 13 is a cross-sectional view illustrating a structure of a semiconductor device according to Embodiment 2. The semiconductor device according to Embodiment 2 is also an IGBT, similarly to Embodiment 1. The IGBT according to Embodiment 2 has the same structure as that of the IGBT according to Embodiment 1, except the structure of a collector electrode.

Figure 14:
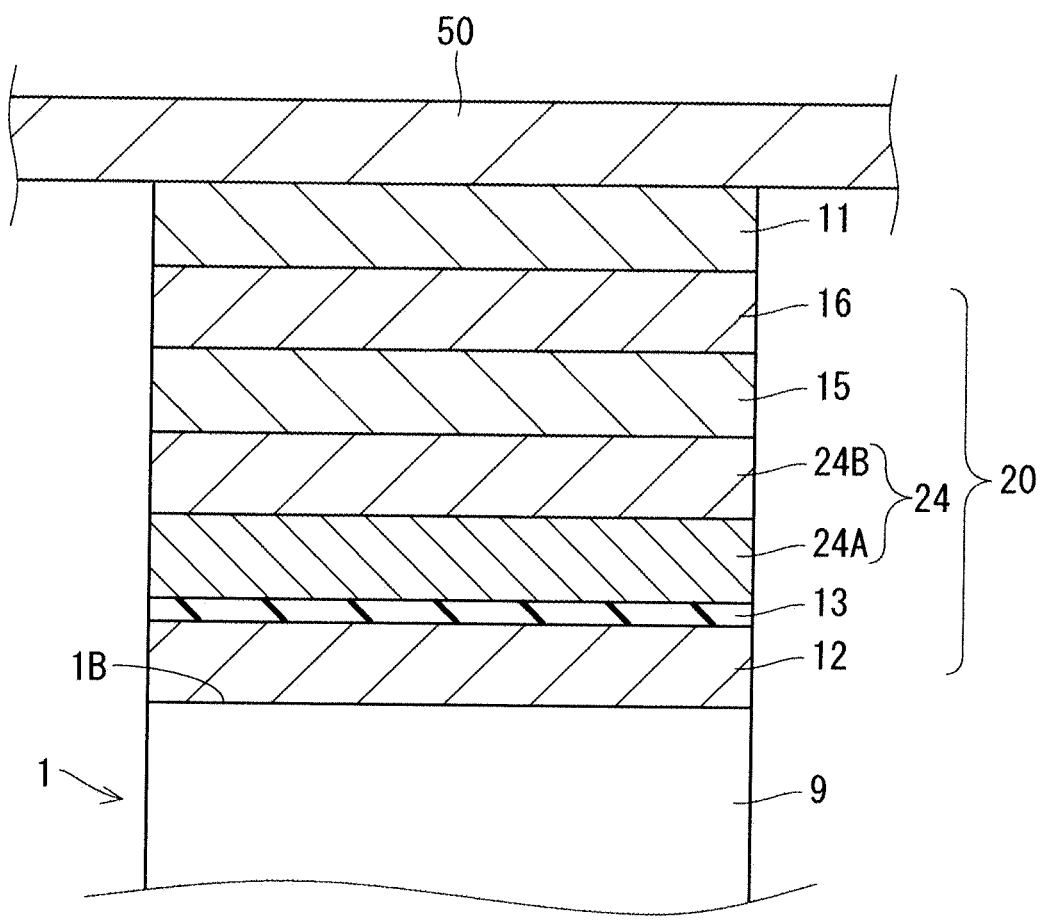
FIG. 14 is a cross-sectional view illustrating a laminated structure of a collector electrode according to Embodiment 2.

FIG. 14 is a cross-sectional view illustrating a laminated structure of a collector electrode 20 according to Embodiment 2. The collector electrode 20 according to Embodiment 2 has the same structure as that of the collector electrode 10 according to Embodiment 1, except the structure of a barrier layer. A barrier layer 24 according to Embodiment 2 includes a first barrier layer 24A and a second barrier layer 24B that are made of different materials.

The collector electrode 20 is bonded to the conductive board 50 through the low-melting metal layer 11. The low-melting metal layer 11 is melted and secured through the thermal treatment process for fixing the collector electrode 20 to the board 50.

The collector electrode 20 includes a plurality of layers laminated on the rear surface 1B of the semiconductor substrate 1. The collector electrode 20 includes the first metal layer in contact with the rear surface 1B of the semiconductor substrate 1, the oxide layer 13 formed on the surface of the first metal layer, and the second metal layer formed on the surface of the oxide layer 13. In the collector electrode 20 according to Embodiment 2, the first metal layer corresponds to the adhesion layer 12, and the second metal layer corresponds to the barrier layer 24.

The collector electrode 20 according to Embodiment 2 further includes the electrode layer 15 on the surface of the barrier layer 24, and the affinity layer 16 on the surface of the electrode layer 15.

The adhesion layer 12 is a metal layer containing, as a main component, Al having good adhesion to a semiconductor. The adhesion layer 12 according to Embodiment 2 is an Al alloy produced by adding Si to Al. The concentration of the added Si is approximately 1 wt % for preventing the diffusion of Si atoms in the adhesion layer 12. The adhesion layer 12 improves the adhesion between the collector layer 9 that is a semiconductor and the collector electrode 20 that are made of metals.

The oxide layer 13 contains a metal and oxygen. The oxide layer 13 according to Embodiment 2 contains an Al oxide. The oxide layer 13 is preferably several to 7 nm thick. The oxide layer 13 prevents carbon contamination while suppressing increase in the electrical resistance of the collector electrode 20.

The barrier layer 24 includes the first barrier layer 24A and the second barrier layer 24B that are laminated in this order on the surface of the oxide layer 13. The first barrier layer 24A contains a nitride that is a high-melting metal. The second barrier layer 24B contains a high-melting metal, for example, Ti. The barrier layer 24 has a function of separating the electrode layer 15 from the adhesion layer 12. In the absence of the barrier layer 24, contact of the molten metal of the low-melting metal layer 11 with the collector electrode 20 for a long time causes a part of the affinity layer 16, the electrode layer 15, or the adhesion layer 12 to be melted into the molten metal. Contact of the molten metal with the collector layer 9 generates voids, thus deteriorating the electrical characteristics or the reliability. The barrier layer 24 has functions of preventing erosion of the low-melting metal layer 11 and reducing the voids to be generated, in the thermal treatment process for fixing the collector electrode 20 to the board 50. Furthermore, the barrier layer 24 also has a function of improving the adhesion with the adhesion layer 12. When the barrier layer 24 only consists of the second barrier layer 24B, the barrier layer 24 has the same structure as that of the barrier layer 14 according to Embodiment 1.

The barrier layer 24 has a two-layer structure of the first barrier layer 24A and the second barrier layer 24B, thus enhancing the effect of separating the electrode layer 15 from the adhesion layer 12.

The electrode layer 15 contains a metal with a low resistance. The electrode layer 15 contains, for example, nickel or a nickel alloy. The electrode layer 15 improves the adhesion between the barrier layer 24 and the affinity layer 16 that are disposed above and below the electrode layer 15.

The affinity layer 16 is disposed in the surface of the collector electrode 20. The affinity layer 16 contains gold having high affinity to a low-melting metal. The affinity layer 16 improves the adhesion between the collector electrode 20 and the low-melting metal layer 11.

Next, a method for manufacturing the semiconductor device according to Embodiment 2 will be described. The method for manufacturing the semiconductor device according to Embodiment 2 is identical to the manufacturing method illustrated in FIG. 3 according to Embodiment 1.

In Step S10, the semiconductor substrate 1 is prepared. The semiconductor substrate 1 prepared herein is in a state where the collector layer 9 of the IGBT is exposed and the collector electrode 20 has not yet been formed. Many surface structures of the IGBT are formed in the surface 1A of the semiconductor substrate 1.

In Step S20, the first metal layer in contact with the principal surface of the semiconductor substrate 1 is formed. Here, the adhesion layer 12 in contact with the surface of the collector layer 9, that is, the rear surface 1B of the semiconductor substrate 1 is formed. The adhesion layer 12 is formed on the rear surface 1B of the semiconductor substrate 1 transported into a vacuum chamber, for example, by sputtering. The adhesion layer 12 is an Al alloy containing Al and Si.

In Step S30, the surface of the first metal layer is oxidized to form the metal oxide film 13A. Here, the surface of the adhesion layer 12 is oxidized to form the metal oxide film 13A. The metal oxide film 13A is formed by, for example, heating the semiconductor substrate 1 using an oven system, etc., into which oxygen has been introduced. Alternatively, the metal oxide film 13A is formed by, for example, exposing the semiconductor substrate 1 taken out of the vacuum chamber to the atmosphere. Here, the metal oxide film 13A is a native oxide film. The metal oxide film 13A according to Embodiment 2 is formed by the atmospheric exposure. The metal oxide film 13A, which is formed by oxidizing the adhesion layer 12 containing Al, contains, as a main component, an Al oxide containing Al and oxygen.

In Step 40, a part of the metal oxide film 13A is etched to form the oxide layer 13. The oxide layer 13 is etched through, for example, the wet treatment of immersing the semiconductor substrate 1 into an acidic chemical solution or the dry treatment of exposing the semiconductor substrate 1 to ion or plasma. The acidic chemical solution in the wet treatment is, for example, hydrofluoric acid. The plasma in the dry treatment contains, for example, hydrogen. The metal oxide film 13A according to Embodiment 2 is etched using plasma containing hydrogen and Ar. The oxide layer 13 has a thickness enough to suppress the alloying reaction of Al and Ti, at a thermal treatment temperature applied when the collector electrode 20 is fixed to the board 50 through the low-melting metal layer 11. The thermal treatment temperature is, for example, approximately 300° C. to 500° C., and the oxide layer 13 is preferably several to 7 nm thick. Thus, etching approximately at least a fraction of a nanometer of the metal oxide film 13A formed in Step S30 can form the oxide layer 13 with the thickness having the aforementioned range.

In Step S50, the second metal layer is formed on the surface of the oxide layer 13. In Embodiment 2, the barrier layer 24, the electrode layer 15, and the affinity layer 16 are formed in order on the surface of the oxide layer 13. Immediately after the oxide layer 13 is formed, the semiconductor substrate 1 is moved to another vacuum chamber. The barrier layer 24 is formed, in the vacuum chamber, on the surface of the oxide layer 13 by sputtering. Here, a TiN thin film is formed as the first barrier layer 24A, and a Ti thin film is formed as the second barrier layer 24B. The TiN thin film is formed by, for example, sputtering a Ti target with a sputtering gas containing nitrogen. The Ti thin film is formed by, for example, sputtering a Ti target with a sputtering gas containing Ar. Furthermore, the electrode layer 15 and the affinity layer 16 are formed by sputtering or vapor deposition.

With the aforementioned steps, the IGBT including the collector electrode 20 on the rear surface 1B of the semiconductor substrate 1 is completed. The IGBT is fixed to the board 50 through the low-melting metal layer 11, thus fabricating the structure illustrated in FIG. 14.

The semiconductor device with the aforementioned structure includes the oxide layer 13 between the adhesion layer 12 and the first barrier layer 24A. The oxide layer 13 prevents carbon contamination while suppressing increase in the electrical resistance. Furthermore, the barrier layer 24 has the two-layer structure of the first barrier layer 24A and the second barrier layer 24B. The barrier layer 24 with the two-layer structure enhances the effect of separating the electrode layer 15 from the adhesion layer 12.

When in a plurality of metal layers included in an electrode, a layer in direct contact with the principal surface of a semiconductor substrate is an Al layer, a thermal treatment process after formation of the electrode sometimes creates aluminum spikes. The thermal treatment process after formation of the electrode is, for example, a reflow process of bonding an electrode to an external component with solder. The aluminum spikes are created by the interdiffusion of Si included in the semiconductor substrate and Al in the Al layer. Since the semiconductor device described in Embodiment 1 or 2 contains Al and Si in the layer in direct contact with the rear surface of the semiconductor substrate, the semiconductor device can reduce the aluminum spikes.

Furthermore, the reaction of an Al alloy film and a Ti film in a plurality of laminated metal layers sometimes forms $Al_3Ti$ with a high resistance. The oxide layer in the semiconductor device described in Embodiment 1 or 2 prevents $Al_3Ti$ from being formed from the reaction of Al in the adhesion layer and Ti in the barrier layer.

In the plating treatment for forming an electrode including a plurality of laminated metal layers, erosion of Al by a chemical solution sometimes damages Si in the lower layer. The oxide layer in the semiconductor device described in Embodiment 1 or 2 prevents such erosion of Al by the chemical solution and the damage to Si.

Embodiments of the present invention can be freely combined, and each of Embodiments can be appropriately modified or omitted within the scope of the invention.

Although this invention is described in detail, the description is in all aspects illustrative and does not restrict the invention. Therefore, numerous modifications and variations that have not yet been exemplified are devised without departing from the scope of the present invention.

EXPLANATION OF REFERENCE SIGNS 1 semiconductor substrate, 1A surface, 1B rear surface, 9 collector layer, 10 collector electrode, 11 low-melting metal layer, 12 adhesion layer, 13 oxide layer, 13A metal oxide film, 14 barrier layer, 15 electrode layer, 16 affinity layer, 20 collector electrode, 24 barrier layer, 24A first barrier layer, 24B second barrier layer, 50 board.

The invention claimed is:

1. A semiconductor device, comprising:
a semiconductor substrate; and
an electrode including a plurality of layers laminated on a principal surface of the semiconductor substrate,
the electrode including:
a first metal layer in contact with the principal surface of the semiconductor substrate, the first metal layer containing Al;
an oxide layer formed on a surface of the first metal layer, the oxide layer containing a metal and oxygen; and
a second metal layer formed on a surface of the oxide layer, wherein
concentrations of the oxygen in the oxide layer are higher than or equal to $8.0 \times 10^{21}/cm^3$ and lower than or equal to $4.0 \times 10^{22}/cm^3$, and
concentrations of hydrogen in the oxide layer are higher than or equal to the concentrations of the oxygen in the oxide layer.

2. The semiconductor device according to claim 1, wherein
the oxide layer has a thickness of 7 nm or less.

3. A method for manufacturing a semiconductor device, the method comprising:
preparing a semiconductor substrate; and
forming an electrode including a plurality of layers laminated on a principal surface of the semiconductor substrate, wherein
the forming of the electrode includes:
forming a first metal layer in contact with the principal surface of the semiconductor substrate, the first metal layer containing Al;
forming an oxide layer on a surface of the first metal layer, the oxide layer containing a metal and oxygen; and
forming a second metal layer on a surface of the oxide layer, wherein
the forming of the oxide layer includes:
oxidizing the surface of the first metal layer to form a metal oxide film; and
etching a surface of the metal oxide film, and
concentrations of the oxygen in the oxide layer are higher than or equal to $8.0 \times 10^{21}/cm^3$ and lower than or equal to $4.0 \times 10^{22}/cm^3$.

4. The method according to claim 3, wherein
the oxide layer has a thickness of 7 nm or less.

5. The method according to claim 3, wherein
the etching of the surface of the metal oxide film includes etching the surface of the metal oxide film using plasma containing hydrogen or an acid solution containing hydrogen, and
concentrations of the hydrogen in the oxide layer are higher than or equal to the concentrations of the oxygen in the oxide layer.

* * * * *